(12) United States Patent
Hirose et al.

(10) Patent No.: US 8,142,677 B2
(45) Date of Patent: Mar. 27, 2012

(54) PIEZOELECTRIC CERAMIC COMPOSITION

(75) Inventors: Masakazu Hirose, Tokyo (JP);
Tomohisa Azuma, Tokyo (JP);
Norimasa Sakamoto, Tokyo (JP)

(73) Assignee: TDK Corporation, Tokyo (JP)

( * ) Notice: Subject to any disclaimer, the term of this patent is extended or adjusted under 35 U.S.C. 154(b) by 732 days.

(21) Appl. No.: 10/597,366

(22) PCT Filed: Feb. 28, 2005

(86) PCT No.: PCT/JP2005/003266
§ 371 (c)(1),
(2), (4) Date: Jul. 21, 2006

(87) PCT Pub. No.: WO2005/092817
PCT Pub. Date: Oct. 6, 2005

(65) Prior Publication Data
US 2008/0245990 A1    Oct. 9, 2008

(30) Foreign Application Priority Data

Mar. 26, 2004 (JP) ................................. 2004-091866
Aug. 27, 2004 (JP) ................................. 2004-248352

(51) Int. Cl.
C04B 35/00 (2006.01)
C04B 35/495 (2006.01)
H01L 41/18 (2006.01)
H01L 41/187 (2006.01)

(52) U.S. Cl. ............................. 252/62.9 PZ; 252/62.9 R (58) Field of Classification Search ......... 252/301.59 R, 252/301.59 PZ, 62.9 R, 629 PZ
See application file for complete search history.

(56) References Cited

U.S. PATENT DOCUMENTS

| | | | | |
|---|---|---|---|---|
| 3,522,182 A * | 7/1970 | Akashi et al. | ........... | 252/62.9 PZ |
| 3,856,693 A * | 12/1974 | Kim | ................. | 252/62.9 PZ |
| 6,299,791 B1 * | 10/2001 | Yoshizawa et al. | ..... | 252/62.9 PZ |
| 6,383,408 B1 | 5/2002 | Horikawa et al. | | |
| 6,440,324 B1 | 8/2002 | Hayashi et al. | | |
| 6,454,959 B1 | 9/2002 | Yoshizawa et al. | | |
| 6,511,763 B1 | 1/2003 | Kida et al. | | |
| 6,514,426 B2 * | 2/2003 | Tanimoto et al. | ...... | 252/62.9 PZ |
| 6,825,143 B2 | 11/2004 | Nada et al. | | |
| 2002/0041132 A1 | 4/2002 | Yoshizawa et al. | | |
| 2003/0096696 A1 | 5/2003 | Nada et al. | | |
| 2006/0043329 A1 * | 3/2006 | Hirose et al. | ........... | 252/62.9 PZ |

FOREIGN PATENT DOCUMENTS

| | | |
|---|---|---|
| EP | 1519427 A | 3/2005 |
| JP | 05-024916 A | 2/1993 |
| JP | 08-026826 A | 1/1996 |
| JP | 2000-103674 | 4/2000 |
| JP | 2000-327419 | 11/2000 |
| JP | 2001-181033 * | 7/2001 |
| JP | 2002060269 | 2/2002 |
| JP | 2002-208672 | 10/2002 |
| JP | 2002-316871 | 10/2002 |
| JP | 4169203 B | 10/2008 |

OTHER PUBLICATIONS

Hammer. Correlation between Surface Texture and Chemical composition in Undoped, hard, and soft piezoelectric PZT ceramics. Journal of the American Ceramic Society. 81 (3) 721-724 (1998).*
Ise. High Power Characteristics of Piezoelectric Ceramics in Pb(Mn1/3Nb2/3)O3-PbTiO3-PbZr)3 System. Jpn. J. Appl. Phys vol. 28 (1999) pp. 5531-5534.*
Tajimi. Electric-Field induced Crack Growth Behavior in PZT/al2O3 Composites. Journal of the American Ceramics Society. 83 (3) 651-653 (2000).*
Xiang. Microstructure and mechanical properties of small amounts of In2O3 reinforced Pb(ZrxTi1—x)O3 ceramics.Materials Research Bulletin vol. 38, Issue 7, Jun. 19, 2003, pp. 1147-1154.*
Supplementary European Search Report; EP Application No. 05 71 9594, Date of search report Jul. 9, 2009.

* cited by examiner

Primary Examiner — Carol M Koslow
Assistant Examiner — Matthew Hoban
(74) Attorney, Agent, or Firm — Pearne & Gordon LLP (57) ABSTRACT

A piezoelectric ceramic composition excellent in all of the electric property $Q_{max}$, heat resisting properties and temperature characteristics of oscillation frequencies is provided. The piezoelectric ceramic composition comprises a phase mainly comprising lead zirconate titanate having a perovskite structure and an Al-containing phase. In the piezoelectric ceramic composition, the main component preferably comprises Mn and Nb, and is preferably represented by a composition formula of $Pb_{\alpha}[(Mn_{1/3}Nb_{2/3})_xTi_yZr_z]O_3$ (wherein $0.97 \leq \alpha \leq 1.01$, $0.04 \leq x \leq 0.16$, $0.48 \leq y \leq 0.58$, $0.32 \leq z \leq 0.41$).

5 Claims, 8 Drawing Sheets

FIG. 1A

POLARIZATION DIRECTION

| SPECIMEN No. | ADDITIVE | | MAIN COMPONENT $Pb_\alpha[(Mn_{1/3}Nb_{2/3})_x Ti_y Zr_z]O_3$ (x+y+z=1) | | | | ELECTRIC PROPERTIES $Q_{max}$ | MECHANICAL STRENGTH $\sigma_{b3}$ (N/mm²) | HEAT RESISTING PROPERTIES $|\Delta F_0|$ (%) | AL-CONTAINING PHASE |
|---|---|---|---|---|---|---|---|---|---|---|
| | $Al_2O_3$ (wt%) | $SiO_2$ (wt%) | α (mol) | x (mol) | y (mol) | z (mol) | | | | |
| 1 | 0.1 | 0.02 | 0.99 | 0.10 | 0.53 | 0.37 | 120 | 155 | 0.11 | × |
| 2 | 0.3 | | | | | | 135 | 172 | 0.07 | ○ |
| 3 | 0.5 | | | | | | 136 | 179 | 0.08 | ○ |
| 4 | 0.7 | | | | | | 130 | 192 | 0.07 | ○ |
| 5 | 1.0 | | | | | | 133 | 192 | 0.07 | ○ |

FIG. 5

SPECIMEN No. 1

SPECIMEN No. 2

SPECIMEN No. 3

SPECIMEN No. 4

SPECIMEN No. 5

FIG. 6

| SPECIMEN No. | ADDITIVE (β) | | MAIN COMPONENT $Pb_\alpha[(Mn_{1/3}Nb_{2/3})_x Ti_y Zr_z]O_3$ (x+y+z=1) | | | | ELECTRIC PROPERTIES $Q_{max}$ | HEAT RESISTING PROPERTIES $\lvert \Delta k_{15} \rvert$ (%) | TEMPERATURE CHARACTERISTICS | |
|---|---|---|---|---|---|---|---|---|---|---|
| | $Al_2O_3$ (wt%) | $SiO_2$ (wt%) | α (mol) | x (mol) | y (mol) | z (mol) | | | $\lvert \Delta F_0(-40°C) \rvert$ | $\lvert \Delta F_0(85°C) \rvert$ |
| 6 | 0.01 | 0.02 | 0.998 | 0.10 | 0.51 | 0.39 | 135 | 3.9 | 0.18 | 0.08 |
| 7 | 0.02 | | | | | | 125 | 3.0 | 0.16 | 0.05 |
| 8 | 0.10 | | | | | | 128 | 2.9 | 0.21 | 0.10 |
| 9 | 0.50 | | | | | | 145 | 1.9 | 0.27 | 0.14 |
| 10 | 1.00 | | | | | | 110 | 3.0 | 0.33 | 0.19 |
| 11 | 0.10 | | 0.990 | | 0.53 | 0.37 | 121 | 2.3 | 0.09 | 0.05 |
| 12 | 0.30 | | | | | | 135 | 2.4 | 0.04 | 0.03 |
| 13 | 0.50 | | | | | | 136 | 2.3 | 0.04 | 0.07 |
| 14 | 0.70 | | | | | | 121 | 2.2 | 0.03 | 0.10 |
| 15 | 1.00 | | | | | | 133 | 2.2 | 0.04 | 0.07 |
| 16 | 1.50 | | | | | | 122 | 2.1 | 0.02 | 0.06 |
| 17 | 2.00 | | | | | | 121 | 2.4 | 0.02 | 0.10 |
| 18 | 3.00 | | | | | | 104 | 2.8 | 0.00 | 0.09 |
| 19 | 10.00 | | | | | | 73 | | 0.01 | 0.13 |

FIG. 7

| SPECI-MEN No. | ADDITIVE | | MAIN COMPONENT $Pb_\alpha[(Mn_{1/3}Nb_{2/3})_xTi_yZr_z]O_3$ (x+y+z=1) | | | | ELECTRIC PROPERTIES | HEAT RESISTING PROPERTIES | TEMPERATURE CHARACTERISTICS | |
|---|---|---|---|---|---|---|---|---|---|---|
| | $Al_2O_3$ (wt%) | $SiO_2$ (wt%) | α (mol) | x (mol) | y (mol) | z (mol) | $Q_{max}$ | $|\Delta k_{15}|$ (%) | $|\Delta F_0(-40°C)|$ | $|\Delta F_0(85°C)|$ |
| 20 * | 0.5 | 0.02 | 0.990 | 0.02 | 0.56 | 0.42 | 29 | 1.1 | 0.24 | 0.14 |
| 21 | | | | | 0.58 | 0.38 | 81 | 0.9 | 0.11 | 0.14 |
| 22 | | | | 0.04 | 0.56 | 0.40 | 85 | 1.0 | 0.25 | 0.02 |
| 23 | | | | | 0.55 | 0.41 | 117 | 1.4 | 0.29 | 0.09 |
| 24 * | | | | | 0.54 | 0.42 | 108 | 1.4 | 0.54 | 0.19 |
| 25 | | | | 0.06 | 0.56 | 0.38 | 95 | 1.1 | 0.09 | 0.04 |
| 26 * | | | | | 0.52 | 0.42 | 177 | 1.5 | 1.10 | 0.77 |
| 27 * | | | | 0.08 | 0.59 | 0.33 | 98 | 1.5 | 0.28 | 0.41 |
| 28 | | | | | 0.54 | 0.38 | 112 | 1.7 | 0.11 | 0.02 |
| 29 | | | | | 0.55 | 0.36 | 114 | 1.8 | 0.03 | 0.19 |
| 30 | | | | 0.09 | 0.54 | 0.37 | 119 | 1.8 | 0.05 | 0.11 |
| 31 | | | | | 0.53 | 0.38 | 124 | 1.5 | 0.13 | 0.03 |
| 32 | | | | | 0.52 | 0.39 | 154 | 1.8 | 0.24 | 0.07 |
| 33 | | | | | 0.58 | 0.32 | 81 | 1.7 | 0.23 | 0.30 |
| 34 | | | | | 0.54 | 0.36 | 147 | 2.1 | 0.02 | 0.14 |
| 35 | | | | 0.10 | 0.53 | 0.37 | 146 | 1.8 | 0.05 | 0.06 |
| 36 | | | | | 0.52 | 0.38 | 158 | 1.7 | 0.14 | 0.02 |
| 37 | | | | | 0.51 | 0.39 | 183 | 1.6 | 0.25 | 0.13 |
| 38 | | | | | 0.53 | 0.36 | 135 | 2.7 | 0.00 | 0.09 |
| 39 | | | | 0.11 | 0.52 | 0.37 | 127 | 1.9 | 0.07 | 0.00 |
| 40 | | | | | 0.51 | 0.38 | 163 | 2.0 | 0.16 | 0.10 |
| 41 | | | | | 0.50 | 0.39 | 170 | 2.0 | 0.27 | 0.22 |
| 42 | | | | | 0.58 | 0.30 | 80 | 2.2 | 0.29 | 0.40 |
| 43 | | | | 0.12 | 0.56 | 0.32 | 98 | 2.3 | 0.20 | 0.28 |
| 44 | | | | | 0.50 | 0.38 | 177 | 2.6 | 0.13 | 0.15 |
| 45 | | | 0.995 | 0.09 | 0.55 | 0.36 | 128 | 1.3 | 0.00 | 0.17 |
| 46 | | | | | 0.54 | 0.37 | 131 | 1.6 | 0.08 | 0.08 |
| 47 | | | | | 0.53 | 0.38 | 129 | 1.2 | 0.14 | 0.02 |
| 48 | | | | | 0.52 | 0.39 | 154 | 0.8 | 0.26 | 0.10 |

FIG. 8

| SPECIMEN No. | ADDITIVE | | | | | | | MAIN COMPONENT $Pb_\alpha[(Mn_{1/3}Nb_{2/3})_x Ti_y Zr_z]O_3$ (x+y+z=1) | | | | ELECTRIC PROPERTIES | HEAT RESISTING PROPERTIES | TEMPERATURE CHARACTERISTICS | |
|---|---|---|---|---|---|---|---|---|---|---|---|---|---|---|---|
| | $Al_2O_3$ (wt%) | $Ga_2O_3$ (wt%) | $Ta_2O_5$ (wt%) | $Sc_2O_3$ (wt%) | $In_2O_3$ (wt%) | a (wt%) | $SiO_2$ (wt%) | α (mol) | x (mol) | y (mol) | z (mol) | $Q_{max}$ | $|\Delta k_{15}|$ (%) | $|\Delta F_0(-40°C)|$ | $|\Delta F_0(85°C)|$ |
| 49 | – | 0.02 | – | – | – | – | 0.02 | 1.000 | 0.10 | 0.51 | 0.39 | 141 | 2.2 | 0.40 | 0.25 |
| 50 | – | 0.10 | – | – | – | – | | 1.000 | 0.10 | 0.51 | 0.39 | 145 | 2.0 | 0.35 | 0.23 |
| 51 | – | – | 0.50 | – | – | – | | 1.000 | 0.10 | 0.51 | 0.39 | 166 | 2.7 | 0.12 | 0.07 |
| 52 | – | – | 0.50 | – | – | – | | 0.995 | 0.09 | 0.55 | 0.36 | 107 | 2.8 | 0.15 | 0.30 |
| 53 | – | – | 0.50 | – | – | – | | 0.995 | 0.09 | 0.53 | 0.38 | 119 | 1.9 | 0.03 | 0.17 |
| 54 | – | – | 0.50 | – | – | – | | 0.995 | 0.09 | 0.52 | 0.39 | 140 | 1.6 | 0.05 | 0.09 |
| 55 | – | – | – | 0.02 | – | – | | 0.990 | 0.10 | 0.51 | 0.39 | 147 | 2.9 | 0.25 | 0.12 |
| 56 | – | – | – | 0.10 | – | – | | 0.990 | 0.10 | 0.51 | 0.39 | 138 | 2.7 | 0.30 | 0.17 |
| 57 | 0.45 | – | – | – | 0.02 | – | | 0.990 | 0.10 | 0.51 | 0.39 | 131 | 2.2 | 0.25 | 0.15 |
| 58* | – | – | – | – | – | 0.20 | | 1.000 | 0.10 | 0.51 | 0.39 | 81 | 4.5 | 0.15 | 0.13 |
| 59* | – | – | – | – | – | 0.30 | | 1.000 | 0.10 | 0.51 | 0.39 | 129 | 4.7 | 0.09 | 0.04 |
| 60* | – | – | – | – | – | 0.50 | | 1.000 | 0.10 | 0.51 | 0.39 | 120 | 4.2 | 0.16 | 0.13 |

PIEZOELECTRIC CERAMIC COMPOSITION

BACKGROUND OF THE INVENTION

1. Field of the Invention

The present invention relates to a piezoelectric ceramic composition suitable for resonators, filters, sensors and the like.

2. Description of the Prior Art

Most of the piezoelectric ceramic compositions now being put in practical use are constituted with ferroelectrics having the perovskite structure such as PZT (the $PbZrO_3$—$PbTiO_3$ solid solution) based or PT ($PbTiO_3$) based ferroelectrics having the tetragonal system or the rhombohedral system at around room temperature.

These compositions are substituted with third components such as $Pb(Mg_{1/3}Nb_{2/3})O_3$ and $Pb(Mn_{1/3}Nb_{2/3})O_3$, or various additives are added to these compositions to meet a wide variety of required properties.

The piezoelectric ceramic composition has a capability of freely converting electric energy into mechanical energy or vice versa and extracting the energy, and is used as a resonator, filter, actuator, ignition element, ultrasonic motor or the like. When the piezoelectric ceramic composition is used as a resonator, for example, a high $Q_{max}$ value ($Q_{max}$=tan θ: θ is a phase angle) as an electric property is not all that is required. In recent years, surface mount devices have come into wide use, and high heat resisting properties are also required since the piezoelectric ceramic composition is passed through a solder reflow furnace before it is mounted on a printed board. High or satisfactory heat resisting properties means small dispersions in properties after a thermal shock is given.

For example, Patent Document 1 (Japanese Patent Laid-Open No. 2000-103674) has proposed an improvement of the heat resisting properties of a piezoelectric ceramic composition in which to the main component represented by a general formula $Pb_\alpha[(Mn_{1/3}Nb_{2/3})_xTi_yZr_z]O_3$ (in the general formula, $1.00 \leq \alpha \leq 1.05$, $0.07 \leq x \leq 0.28$, $0.42 \leq y \leq 0.62$, and $0.18 \leq z \leq 0.45$, x+y+z=1), $Mn_3O_4$ is added as an additive from 0.3 to 0.8 wt % in relation to 100 wt % of the main component.

Products having piezoelectric ceramic compositions mounted thereon are used in various environments, and therefore the mechanical strength is one of important properties. It is proposed in, for example, Patent Document 2 (Japanese Patent Laid-Open No. 2003-128462) that $SiO_2$ is added for improving the flexural strength. However, it is well known that $SiO_2$ improves the mechanical strength, while it causes a degradation in heat resisting properties, and thus $SiO_2$ is currently used at some point of compromise between both types of properties.

In Patent Document 1, Mn is incorporated as an additive to improve the heat resisting properties of the piezoelectric ceramic composition and in an example in the document, it is possible to obtain excellent heat resisting properties such that the rate of change in electromechanical coupling factor $k_{15}$ before and after a heat resistance test is 2.33% as an absolute value. However, a piezoelectric ceramic composition excellent in all of the electric property $Q_{max}$, heat resisting properties and temperature characteristics of oscillation frequencies has not yet been found in any study including that in Patent Document 1.

SUMMARY OF THE INVENTION

Thus, an object of the present invention is to provide a piezoelectric ceramic composition capable of improving the flexural strength without degrading heat resisting properties. Further, an object of the present invention is to provide a piezoelectric ceramic composition excellent in all of the electric property $Q_{max}$, heat resisting properties and temperature characteristics of oscillation frequencies.

The present inventors have found that in a piezoelectric ceramic composition of a perovskite structure comprising a lead component, the flexural strength is improved by precipitating an Al-containing phase in relation to a main component comprising lead zirconate titanate (hereinafter may be referred to as PZT). Moreover, the inventors have found that the piezoelectric ceramic composition is improved also for heat resisting properties compared to those with no Al-containing phase. That is, the present invention provides a piezoelectric ceramic composition comprising a phase comprising, as a main component, lead zirconate titanate having a perovskite structure, and an Al-containing phase. For the piezoelectric ceramic composition, it is possible to obtain heat resisting properties such that the absolute value $|\Delta F_0|$ of the rate of change in oscillation frequency $F_0$ before and after application of a thermal shock is 0.10% or less, and properties such that the three-point flexural strength $\sigma_{b3}$ is 160 N/mm² or greater.

In the piezoelectric ceramic composition of the present invention, it is preferable that the main component comprises Mn and Nb, and is represented by the composition formula of $Pb_\alpha[(Mn_{1/3}Nb_{2/3})_xTi_yZr_z]O_3$ (wherein $0.97 \leq \alpha \leq 1.01$, $0.04 \leq x \leq 0.16$, $0.48 \leq y \leq 0.58$, $0.32 \leq z \leq 0.41$).

Additionally, in the piezoelectric ceramic composition of the present invention, the Al-containing phase preferably comprises $Al_2O_3$.

Furthermore, the inventors have found that the above Al is effective for improvement of electric property $Q_{max}$ and temperature characteristics of oscillation frequencies in addition to improvement of heat resisting properties. Moreover, the inventors have found that Ga, In, Ta and Sc exhibit same effects as the effect of Al. That is, the present invention is based on the findings described above, and is a piezoelectric ceramic composition comprising as additives at least one selected from the group consisting of Al, Ga, In, Ta and Sc in an amount of 0.01 to 15.0 wt % in terms of oxides of the elements, in relation to a main component represented by the formula 1, $Pb_\alpha[(Mn_{1/3}Nb_{2/3})_xTi_yZr_z]O_3$, wherein α, x, y and z fall within the ranges of $0.97 \leq \alpha \leq 1.01$, $0.04 \leq x \leq 0.16$, $0.48 \leq y \leq 0.58$ and $0.32 \leq z \leq 0.41$, respectively, and α, x, y and z each represent a molar ratio.

For the piezoelectric ceramic composition of the present invention, it is made possible, by specifying a main component and specifying the elements and amounts of additives, to obtain properties such that the electric property $Q_{max}$ is 30 or greater, the absolute value of the rate of change in electromechanical coupling factor $k_{15}$, $|\Delta k_{15}|$, before and after application of a thermal shock is 4% or less, the absolute value of the rate of change in oscillation frequency $F_0$ at −40° C., $|\Delta F_0 (-40° C.)|$, with reference to 20° C., is 0.4% or less, and the absolute value of the rate of change in oscillation frequency $F_0$ at 85° C., $|\Delta F_0 (85° C.)|$, with reference to 20° C. is 0.4% or less. The properties are specified by methods according to descriptions in the sections of "Detailed Description of the Preferred Embodiments" and "Examples" described later.

It is preferable that the piezoelectric ceramic composition of the present invention has α, x, y and z of the main component falling within the range of $0.98 \leq \alpha \leq 1.00$, $0.06 \leq x \leq 0.14$, $0.49 \leq y \leq 0.57$ and $0.33 \leq z \leq 0.40$, respectively, and comprises Al as an additive in an amount of 0.05 to 5.0 wt % in terms of $Al_2O_3$. Moreover, the piezoelectric ceramic composition of the present invention preferably comprises Si as an additive in an amount of 0.005 to 0.15 wt % in terms of $SiO_2$.

According to the present invention described above, a piezoelectric ceramic composition comprising a sintered body having as a main component a perovskite compound having Pb, Zr, Ti, Mn and Nb as main components, and comprising as additives at least one selected from the group consisting of Al, Ga, In, Ta and Sc, wherein the electric property $Q_{max}$ is 100 or greater, the absolute value of the rate of change in electromechanical coupling factor $k_{15}$, $|\Delta k_{15}|$, before and after application of a thermal shock is 2% or less, the absolute value of the rate of change in oscillation frequency $F_0$ at $-40°$ C., $|\Delta F_0 (-40° C.)|$, with reference to $20°$ C. is 0.2% or less, and the absolute value of the rate of change in oscillation frequency $F_0$ at $85°$ C., $|\Delta F_0 (85° C.)|$, with reference to $20°$ C. is 0.2% or less, can be obtained.

According to the present invention, a piezoelectric ceramic composition having an improved mechanical strength without degradation in heat resisting properties can be obtained by making an Al-containing phase exist in a matrix. Moreover, according to the present invention, a piezoelectric ceramic composition excellent in all of the electric property $Q_{max}$, heat resisting properties and temperature characteristics of oscillation frequencies can be obtained.

DETAILED DESCRIPTION OF THE PREFERRED EMBODIMENTS

A piezoelectric ceramic composition according to the present invention will be described in detail below.
<Piezoelectric Ceramic Composition>

The piezoelectric ceramic composition according to the present invention has PZT having a perovskite structure as a main component, and the main component preferably comprises Mn and Nb. Further, the piezoelectric ceramic composition according to the present invention has as a main component a perovskite compound having Pb, Zr, Ti, Mn and Nb as main components. The piezoelectric ceramic composition having the above main component according to the present invention is typically composed of a sintered body. The sintered body comprises grains having the above main component and grain boundary phase exists between the grains in addition to a phase having the above main component. In the piezoelectric ceramic composition of present invention, there exists an Al-containing phase in addition to the phase having the above main component, and the Al-containing phase can be generated by adding a predetermined amount of $Al_2O_3$ as a raw material. It can be understood that the added $Al_2O_3$ is randomly precipitated in the sintered body.

As shown in Examples described later, the Al-containing phase is not generated if the amount of $Al_2O_3$ added is less than a predetermined amount. The effect of improving heat resisting properties can be observed even if the amount of $Al_2O_3$ added is less than the predetermined amount. In addition, if the amount of $Al_2O_3$ added is greater than the predetermined amount, both the flexural strength and heat resisting properties are improved. From the results described above, it is estimated that $Al_2O_3$ is contained in grains (lattices) composed of the main component to exhibit the effect of improving heat resisting properties of the main component, i.e. PZT itself, and excessive $Al_2O_3$ incapable of being contained in grains is randomly precipitated in mainly grain boundaries of the sintered body to strengthen the binding between grains to contribute to an improvement in flexural strength.

For generating the Al-containing phase exhibiting the effect of improving the flexural strength, $Al_2O_3$ is added to the main component, especially represented by $Pb_\alpha[(Mn_{1/3}Nb_{2/3})_xTi_yZr_z]O_3$ (formula (1)) in an amount of preferably 0.15 wt % or greater, more preferably 0.6 wt % or greater. The properties of the piezoelectric ceramic composition are not impaired even though the amount of $Al_2O_3$ added is increased, and therefore the upper limit of the amount is not particularly limited, but since it is understood that the obtained effect is saturated, the amount of $Al_2O_3$ added is 15.0 wt % or less, preferably 5.0 wt % or less, further preferably 1.5 wt % or less in relation to the main component.

The piezoelectric ceramic composition of the present invention preferably has a main component represented by the following formula (1). The chemical composition mentioned herein is a composition after sintering.

$$Pb_\alpha[(Mn_{1/3}Nb_{2/3})_xTi_yZr_z]O_3 \qquad \text{formula (1)}$$

wherein $\alpha$, x, y and z fall within the ranges of $0.97 \leq \alpha \leq 1.01$, $0.04 \leq x \leq 0.16$, $0.48 \leq y \leq 0.58$ and $0.32 \leq z \leq 0.41$, respectively, and $\alpha$, x, y and z each represent a molar ratio.

Next, description will be made below on the reasons for imposing constraints on $\alpha$, x, y and z in formula (1).

The quantity $\alpha$ representing the Pb content is constrained to fall within the range of $0.97 \leq \alpha \leq 1.01$. When $\alpha$ is less than 0.97, it is difficult to obtain a dense sintered body. On the other hand, when $\alpha$ exceeds 1.01, no satisfactory heat resisting properties can be obtained. Accordingly, $\alpha$ is constrained to fall within the range of $0.97 \leq \alpha \leq 1.01$. The range of $\alpha$ is preferably $0.98 \leq \alpha \leq 1.00$, and more preferably $0.99 \leq \alpha \leq 1.00$.

The quantity x determining the Mn content and the Nb content is constrained to fall within the range of $0.04 \leq x \leq 0.16$.

If x is less than 0.04, the electric property $Q_{max}$ is small. On the other hand, when x exceeds 0.16, no satisfactory heat resisting properties can be obtained. Accordingly, x is constrained to fall within the range of $0.04 \leq x \leq 0.16$. The range of x is preferably $0.06 \leq x \leq 0.14$, and more preferably $0.07 \leq x \leq 0.11$.

The quantity y representing the Ti content is constrained to fall within the range of $0.48 \leq y \leq 0.58$. When y is less than 0.48, no satisfactory heat resisting properties can be obtained. On the other hand, when y exceeds 0.58, it is difficult to obtain satisfactory temperature characteristics. Accordingly, y is constrained to fall within the range of $0.48 \leq y \leq 0.58$. The range of y is preferably $0.49 \leq y \leq 0.57$, and more preferably $0.50 \leq y \leq 0.55$.

Satisfactory temperature characteristics means small dispersions in properties of the piezoelectric ceramic composition associated with a change in temperature in working environments.

The quantity z representing the Zr content is constrained to fall within the range of $0.32 \leq z \leq 0.41$. When z is less than 0.32, or exceeds 0.41, no satisfactory temperature characteristics can be obtained. Accordingly, z is constrained to fall within the range of $0.32 \leq z \leq 0.41$. The range of z is preferably $0.33 \leq z \leq 0.40$, and more preferably $0.34 \leq z \leq 0.39$.

The piezoelectric ceramic composition having the above main component according to the present invention may comprise as additives at least one element selected from the group consisting of Ga, In, Ta and Sc in an amount of 0.01 to 15.0 wt % in terms of the oxide of each element, in addition to Al described above. Incorporation of the above additives into the above main component provides a piezoelectric ceramic composition excellent in electric property, heat resisting properties and temperature characteristics. The amount of additive is 0.01 to 15.0 wt %, preferably 0.05 to 5.0 wt %, further preferably 0.15 to 1.5 wt % in terms of the oxide of the element in relation to $Pb_\alpha[(Mn_{1/3}Nb_{2/3})_xTi_yZr_z]O_3$ of the formula (1). Al is most preferably used as an additive.

In addition, $SiO_2$ may be incorporated as an additive to the piezoelectric ceramic composition according to the present invention. The incorporation of $SiO_2$ is effective for improving the flexural strength of piezoelectric ceramic composition. When $SiO_2$ is incorporated, in relation to $Pb_\alpha[(Mn_{1/3}Nb_{2/3})_xTi_yZr_z]O_3$ in formula (1), the $SiO_2$ content is preferably 0.005 to 0.15 wt %, more preferably 0.01 to 0.12 wt %, and further preferably 0.01 to 0.07 wt %.

<Production Method>

Now, description will be made below on the preferable production method of the piezoelectric ceramic composition according to the present invention, by following the sequence of the steps of the method.

(Raw Material Powders and Weighing Out)

As the raw materials for the main components, there are used powders of oxides or powders of compounds to be converted to oxides when heated. More specifically, PbO powder, $TiO_2$ powder, $ZrO_2$ powder, $MnCO_3$ powder, $Nb_2O_5$ powder and the like can be used. The raw material powders are weighed out respectively so that the composition represented by formula (1) may be actualized.

Then, oxide powders of at least one element selected from the group consisting of Al, Ga, In, Ta and Sc are added as additives in an amount of 0.01 to 15.0 wt % in relation to the total weight of the component powders. As raw material powders of additives, $Al_2O_3$ powder, $Ga_2O_3$ powder, $Ta_2O_5$ powder, $Sc_2O_3$ powder and $In_2O_3$ powder may be used.

When $SiO_2$ is to be incorporated in addition to these additives, additionally $SiO_2$ powder is prepared. It is recommended that the mean particle size of each of the raw material powders is appropriately selected within the range of 0.1 to 3.0 μm.

Incidentally, without restricting to the above described raw material powders, a powder of a composite oxide containing two or more metals may be used as a raw material powder.

(Calcination)

The raw material powders are subjected to wet mixing and then subjected to a calcination while being maintained at temperatures falling within the range from 700 to 950° C. for a predetermined period of time. This calcination is recommended to be conducted under the atmosphere of $N_2$ or air, setting the maintaining time within the range from 0.5 to 5.0 hours.

Incidentally, although description has been made above for the case where the powders of the main components and the additives are mixed together, and then both of them are subjected to calcination, the timing for adding the raw material of the additives is not limited to the above described timing. Alternatively, for example, firstly the powders of the main components are weighed out, mixed, calcined and pulverized; then, to the main component powder thus obtained after calcination and pulverization, the raw material powder of the additives may be added in a predetermined content to be mixed with the main component powder.

(Granulation and Compacting)

The pulverized powder is granulated for the purpose of smoothly carrying out a subsequent compacting step.

At this time, a small amount of an appropriate binder, for example polyvinyl alcohol (PVA) is added to the pulverized powder, and they are sufficiently mixed, and granulated through, for example, a mesh to obtain a granulated powder. Then, the thus granulated powder is compacted by pressing under a pressure of 200 to 300 MPa to obtain a compacted body having a desired shape.

(Sintering)

After the binder, added at the time of molding, has been removed from the compacted body, the compacted body is heated and maintained at temperatures within the range from 1100 to 1250° C. for a predetermined period of time to obtain a sintered body. In this connection, the atmosphere is recommended to be $N_2$ or air. The maintaining time period of the heating is recommended to be appropriately selected within the range from 0.5 to 4 hours.

(Polarization)

After electrodes for the polarization have been formed on the sintered body, the polarization is carried out. The polarization is conducted under the conditions such that the polarization temperature falls within the range from 50 to 300° C., and an electric field of 1.0 to 2.0 Ec (Ec being the coercive field) is applied to the sintered body for 0.5 to 30 minutes.

When the polarization temperature is lower than 50° C., the Ec is elevated and accordingly the voltage needed for polarization becomes high, so that the polarization is made difficult. On the other hand, when the polarization temperature exceeds 300° C., the insulation property of the insulating oil is markedly lowered, so that the polarization is made difficult. Consequently, the polarization temperature is made to fall within the range from 50 to 300° C. The polarization temperature is preferably 60 to 250° C., and more preferably 80 to 200° C.

Additionally, when the applied electric field is lower than 1.0 Ec, the polarization does not proceed. On the other hand, when the applied electric field is higher than 2.0 Ec, the actual voltage becomes high, so that the dielectric breakdown of sintered body tends to be occurred and accordingly it becomes difficult to prepare a piezoelectric ceramic composition. Accordingly, the electric filed to be applied in the polarization is made to be 1.0 to 2.0 Ec. The applied electric field is preferably 1.1 to 1.8 Ec, and more preferably 1.2 to 1.6 Ec.

When the polarization time is less than 0.5 minute, the polarization is not progressed to a sufficient extent, so that the properties cannot be attained to a sufficient extent. On the other hand, when the polarization time exceeds 30 minutes, the time required for the polarization becomes long, so that the production efficiency is degraded. Accordingly, the polarization time is made to be 0.5 to 30 minutes. The polarization time is preferably 0.7 to 20 minutes, and more preferably 0.9 to 15 minutes.

Figure 1A:
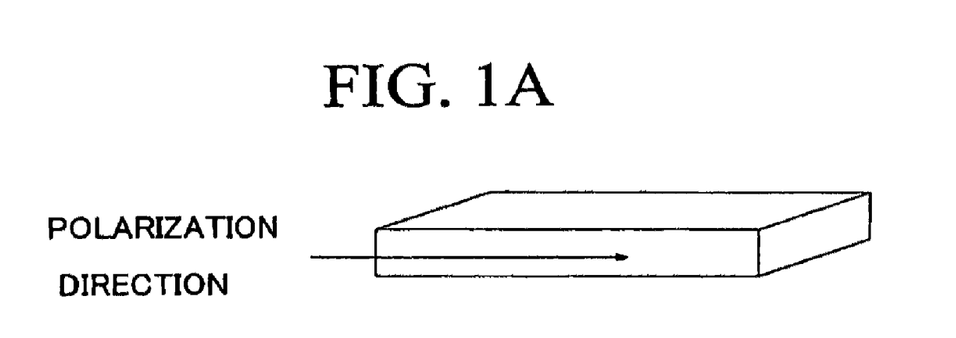
FIG. 1 is a view for explaining a polarization direction.
Figure 1B:
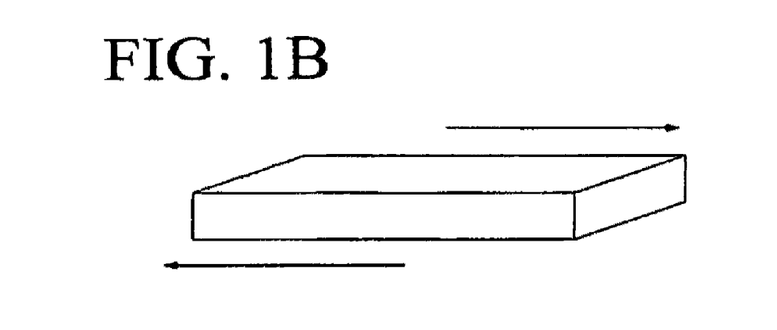

The polarization is conducted in a bath of an insulating oil such as a silicon oil heated to the above described temperature. Incidentally, the polarization direction is determined according to the desired vibrational mode. In this connection, when the desired vibrational mode is a thickness-shear vibration mode, the polarization direction is taken as shown in FIG. 1A; the thickness-shear vibration is such a vibration as illustrated in FIG. 1B.

The piezoelectric ceramic composition is lapped to a desired thickness, and thereafter vibrating electrodes are formed. Then, using a dicing saw or the like, the piezoelectric ceramic composition is cut into a desired shape to function as a piezoelectric element.

The piezoelectric ceramic composition of the present invention is suitably used as the materials for the piezoelectric elements for use in resonators, filters, actuators, ignition elements, ultrasonic motors and the like.

<Properties of Piezoelectric Ceramic Composition>

(Flexural Strength)

For the piezoelectric ceramic composition of the present invention, it is possible to obtain a mechanical strength such that the three-point flexural strength $\sigma_{b3}$ is 160 N/mm² or greater, preferably 170 N/mm² or greater, further preferably 180 N/mm² or greater.

Here, the three-point flexural strength $\sigma_{b3}$ in the present invention is determined from the following formula (2) in accordance with Japanese Industrial Standards JIS R 1601. In the formula (2), P represents a load (N), L represents a distance (m) between support rolls, w represents a width (m) of a specimen, t represents a thickness (m) of a specimen, and yb represents a net displacement (m) at a load point.

$$\sigma_{b3} = \frac{L^3 (P_2 - P_1)}{4wt^3 (y_{b2} - y_{b1})} \quad \text{formula (2)}$$

(Heat Resisting Properties)

The piezoelectric ceramic composition of the present invention can have excellent heat resisting properties. In the present invention, heat resisting properties were evaluated on two criteria. One is a heat resisting property regarding an oscillation frequency $F_0$, and the other is a heat resisting property regarding an electromechanical coupling factor $k_{15}$. They will be described below in this order.

For the piezoelectric ceramic composition of the present invention, the heat resisting property $|\Delta F_0|$ regarding the oscillation frequency $F_0$ can be 0.10% or less. The heat resisting property $|\Delta F_0|$ is determined as follows. The $\Delta F_0$ of the obtained specimen is measured (before test), and the specimen is then wrapped with an aluminum foil, and immersed in a solder bath at 265° C. for 10 seconds. Then, the specimen is taken out from the aluminum foil, and left standing in air at room temperature for 24 hours. After the specimen is left standing for 24 hours, $\Delta F_0$ is measured again (after test). The rate of change in $F_0$ before and after the test (after 24 hours) is determined based on the formula (3), and heat resisting properties are evaluated by the absolute value ($|\Delta F_0|$). $|\Delta F_0|$ is the absolute value of the rate of change in oscillation frequency $F_0$ before and after application of a thermal shock. $|\Delta F_0|$ obtained in the Example described later is determined by the same procedure.

$$\Delta F_0 = \frac{F_0(\text{after test}) - F_0(\text{before test})}{F_0(\text{after test})} \times 100(\%) \quad \text{formula (3)}$$

The oscillation frequency $F_0$ in the present invention is related to the following formulas (4) to (7) in terms of the equivalent circuit constants.

Figure 2:
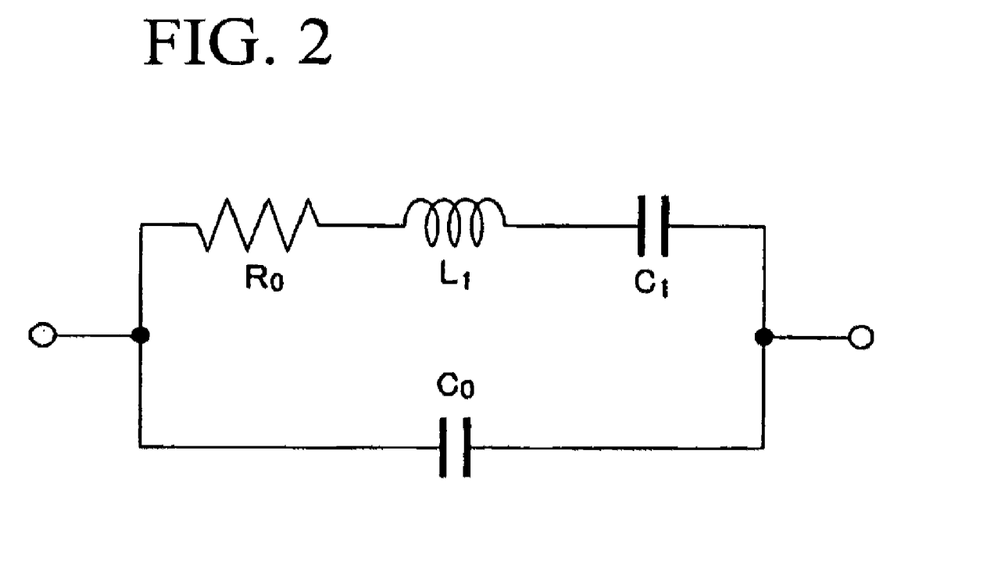
FIG. 2 is an equivalent circuit diagram of a piezoelectric resonator.

In formulas (4) to (7), $F_0$ represents an oscillation frequency, Fr represents a resonant frequency, Fa represents an anti-resonant frequency, $C_1$ represents a motional capacitance, $C_0$ represents a shunt capacitance, $C_L$ is defined in the formula (7), Cd represents a free capacitance, and $C_{L1}$ and $C_{L2}$ each represent a load capacitance. An equivalent circuit for the piezoelectric resonator is shown in FIG. 2. In FIG. 2, $R_0$ represents a resonant impedance, $L_1$ represents an equivalent inductance, $C_1$ represents a motional capacitance, and $C_0$ represents the shunt capacitance.

As shown by formula (4), the oscillation frequency $F_0$ is dependent on the four parameters, namely, the resonant frequency Fr, the motional capacitance $C_1$, the shunt capacitance $C_0$, and $C_L$. Additionally, as shown by formulas (5) to (7), the motional capacitance $C_1$, the shunt capacitance $C_0$, and $C_L$ each are associated with plural parameters.

$$F_0 = Fr \sqrt{1 + \frac{C_1}{C_0 + C_L}} \quad \text{formula (4)}$$

$$C_1 = \frac{Fa^2 - Fr^2}{Fa^2} Cd \quad \text{formula (5)}$$

$$C_0 = Cd - C_1 \quad \text{formula (6)}$$

$$C_L = \frac{C_{L1} \cdot C_{L2}}{C_{L1} + C_{L2}} \Rightarrow \frac{C_{L1}}{2} (C_{L1} = C_{L2}) \quad \text{formula (7)}$$

For the piezoelectric ceramic composition of the present invention, the heat resisting property $|\Delta k_{15}|$ regarding the electromechanical coupling factor $k_{15}$ can be 4% or less. The heat resisting property $|\Delta k_{15}|$ in the present invention is obtained on the basis of the following procedures. The electromechanical coupling factor $k_{15}$ is measured with a measurement frequency of about 4 MHz by use of an impedance analyzer (4294A manufactured by Agilent Technologies Co., Ltd.). The electromechanical coupling factor $k_{15}$ is obtained on the basis of the following formula (8).

In the formula (8), Fr represents a resonant frequency, and Fa represents an anti-resonant frequency. The electromechanical coupling factor $k_{15}$ of the obtained specimen is measured (before test), and the specimen is then wrapped with an aluminum foil, and immersed in a solder bath at 265° C. for 10 seconds. Then, the specimen is taken out from the aluminum foil, and left standing in air at room temperature for 24 hours. After the specimen is left standing for 24 hours, the electromechanical coupling factor $k_{15}$ is measured again. The rate of change in $\Delta k_{15}$ before and after the test (after 24 hours) is determined based on the formula (9), and heat resisting properties are evaluated by the absolute value ($|\Delta k_{15}|$). $|\Delta k_{15}|$ is the absolute value of the rate of change in electromechanical coupling factor $k_{15}$ before and after application of a thermal shock. $|\Delta k_{15}|$ obtained in the Examples described later is determined by the same procedure.

$$k_{15} = \sqrt{\frac{\pi}{2} \cdot \frac{Fr}{Fa} \cot\left(\frac{\pi}{2} \cdot \frac{Fr}{Fa}\right)} \quad \text{formula (8)}$$

$$\Delta k_{15} = \frac{k_{15}(\text{after test}) - k_{15}(\text{before test})}{k_{15}(\text{after test})} \times 100(\%) \quad \text{formula (9)}$$

(Electric Property $Q_{max}$)

For the piezoelectric ceramic composition of the present invention, it is possible to obtain electric properties such that $Q_{max}$ is 30 or greater, preferably 80 or greater, further preferably 100 or greater. $Q_{max}$ represents a maximum value of Q (=tan θ, θ: phase angle (deg)) between the resonant frequency fr and the anti-resonant frequency fa, is one of important properties as a resonator, and contributes to low-voltage drive.

The piezoelectric ceramic composition is also excellent in temperature characteristics. For the present invention, the temperature property regarding the oscillation frequency can be 0.4% or less. For this temperature property, an oscillation frequency $F_0$ (20° C.) at 20° C. is measured as a reference, and further an oscillation frequency (−40° C.) at −40° C. and an oscillation frequency (85° C.) at 85° C. are measured. The rate of change in oscillation frequency, $\Delta F_0$(−40° C.), between the oscillation frequency $F_0$ and the oscillation frequency (−40° C.) at −40° C., and the rate of change in oscillation frequency, $\Delta F_0$(85° C.), between the oscillation frequency $F_0$ and the oscillation frequency (85° C.) at 85° C. are determined from formulas (10) and (11) to evaluate temperature characteristics.

$$\Delta F_0(-40° C.) = \frac{F_0(-40° C.) - F_0(20° C.)}{F_0(20° C.)} \times 100(\%) \quad \text{formula (10)}$$

$$\Delta F_0(85° C.) = \frac{F_0(85° C.) - F_0(20° C.)}{F_0(20° C.)} \times 100(\%) \quad \text{formula (11)}$$

For the piezoelectric ceramic composition of the present invention, it is possible to obtain electric properties such that $Q_{max}$ is 30 or greater, heat resisting properties such that $|\Delta k_{15}|$ is 4% or less, and temperature characteristics such that $|\Delta F_0$ (−40° C.)| is 0.4% or less and $|\Delta F_0$ (85° C.)| is 0.4% or less.

Further, according to the present invention, it is possible to obtain electric properties such that $Q_{max}$ is 100 or greater, heat resisting properties such that $|\Delta k_{15}|$ is 2% or less, and temperature characteristics such that $|\Delta F_0$ (−40° C.)| is 0.2% or less and $|\Delta F_0$ (85° C.)| is 0.2% or less.

Further, according to the present invention, it is possible to obtain electric properties such that $Q_{max}$ is 120 or greater, heat resisting properties such that $|\Delta k_{15}|$ is 1.8% or less, and temperature characteristics such that $|\Delta F_0$ (−40° C.)| is 0.1% or less and $|\Delta F_0$ (85° C.)| is 0.1% or less.

EXAMPLE 1

As the raw materials, there were prepared the powders of PbO, $TiO_2$, $ZrO_2$, $MnCO_3$, $Nb_2O_5$, $Al_2O_3$ and $SiO_2$; the raw material powders were weighed out in such a way that the formula, $Pb_{0.99}[(Mn_{1/3}Nb_{2/3})_{0.10}Ti_{0.53}Zr_{0.37}]O_3$ in molar ratio was satisfied. Thereafter, $SiO_2$ as an additive was added in an amount of 0.02 wt % in relation to the total weight of the powders, $Al_2O_3$ powder was added in the amount shown in FIG. 4, and they were wet-mixed for 10 hours using a ball mill.

The slurries thus obtained were dried to a sufficient level, and compacted with a press, thereafter calcined in air in a manner maintained at 800° C. for 2 hours. The calcined substances were pulverizied with a ball mill so as to have a mean particle size of 0.7 μm, and then the pulverized powders were dried. The dried powders were added with PVA (polyvinyl alcohol) as a binder in an appropriate content, and were granulated. About 3 g of the granulated powder was put into a die having a 20 mm long×20 mm wide cavity, and the granulated powder was compacted under a pressure of 245 MPa using a uniaxial press machine. The compacted bodies thus obtained were subjected to the treatment for removing the binder, and thereafter maintained at 1150 to 1250° C. for 2 hours in the air to obtain sintered bodies (specimens) each having the size of 17.5 mm long×17.5 mm wide×1.5 mm thick.

Figure 3:
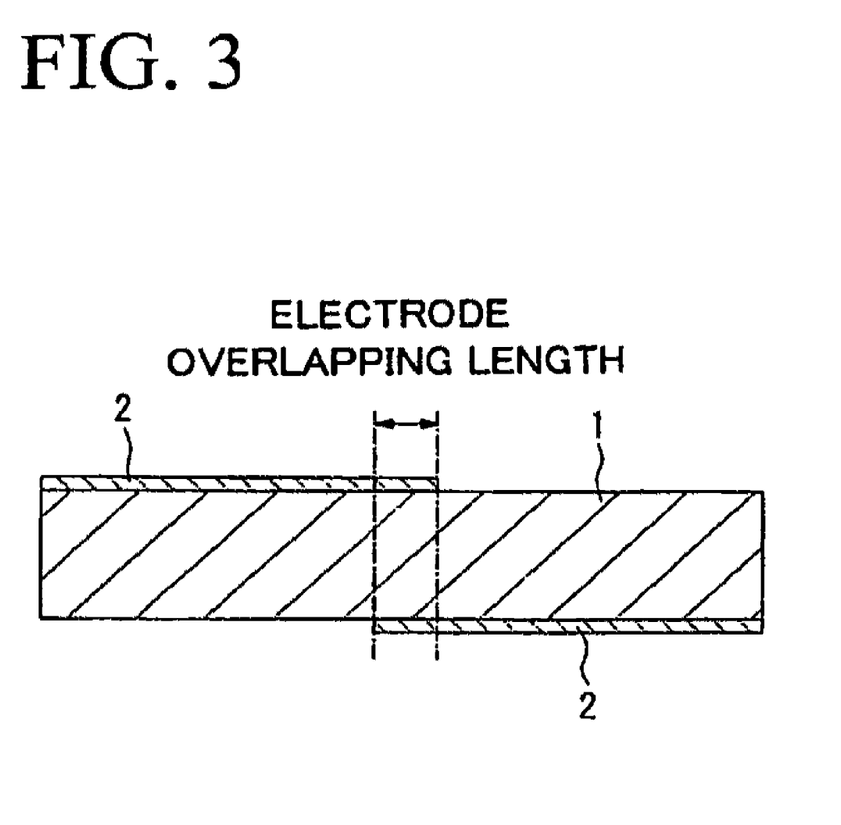
FIG. 3 is a sectional view of a specimen with vibrating electrodes formed on both upper and lower surfaces.

Both surfaces of the specimen were flattened by a lapping machine to obtain a thickness of 0.5 mm, the specimen was then cut into a size of 15 mm long×5.0 mm wide, and temporary electrodes for polarization were formed at both ends thereof (along the width of 5.0 mm). Thereafter, the specimens each were subjected to a polarization in which each of the specimens was immersed in a silicon oil bath at 150° C., and applied an electric field of 3.0 kV/mm for 15 minute. Here, it should be noted that the polarization direction was chosen as shown in FIG. 1A. Subsequently, the temporary electrodes for polarization were removed. Here, it should also be noted that the size of each of the specimens after removing the temporary electrodes was 15 mm long×4 mm wide×0.5 mm thick. Both surfaces of each of the specimens were lapped by a lapping machine so as for the thickness of each of the specimens to be 0.3 mm, and then, vibrating electrodes 2 were formed on both surfaces (both polished surfaces) of each of the specimens 1 with the aid of a vacuum evaporation apparatus, as shown in FIG. 3. The vibrating electrodes 2 were each formed of a 0.01 μm thick Cr sublayer and a 2 μm thick Ag layer. The overlapping area of each of the vibrating electrodes 2 was made to be 1.5 mm long along the lengthwise direction.

Figure 4:
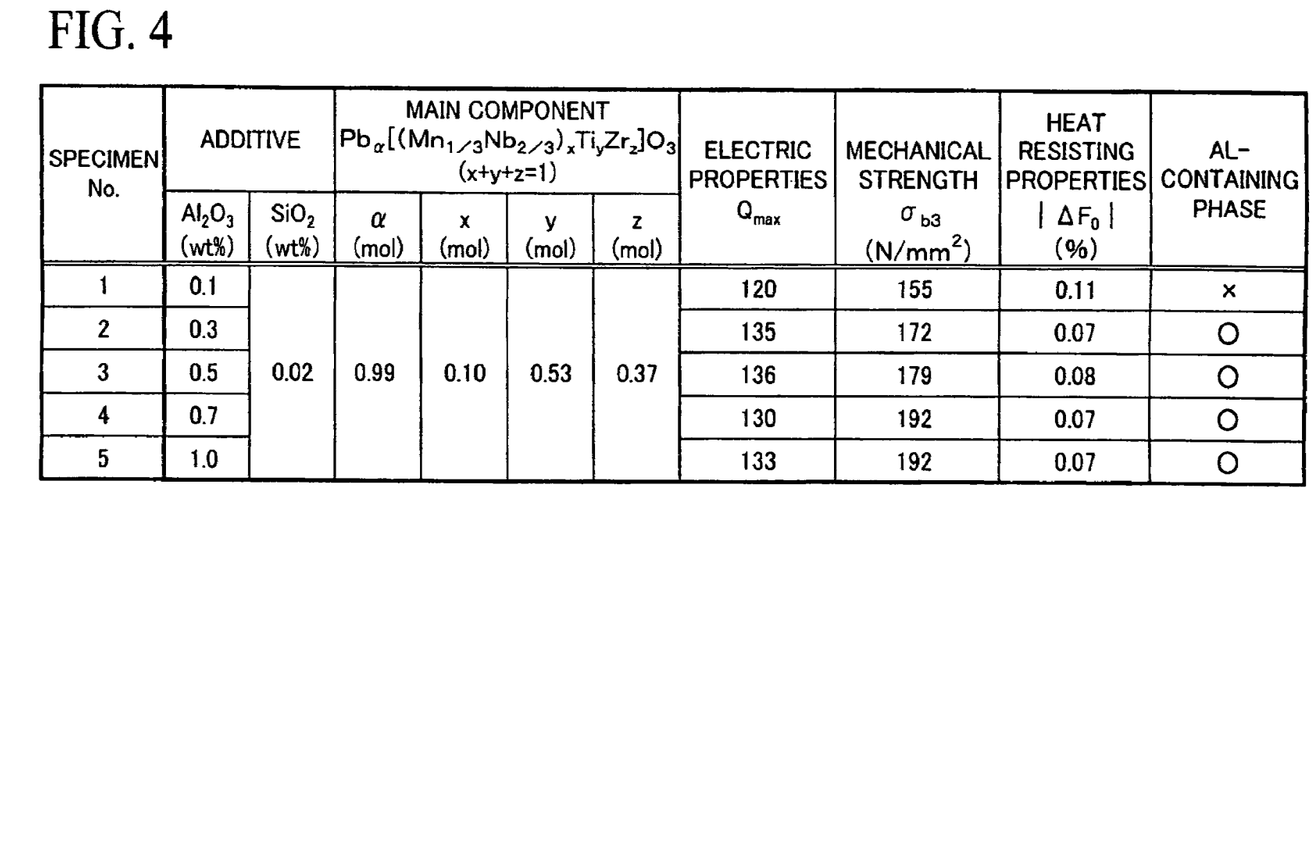
FIG. 4 is a table showing compositions and properties of specimens of Example 1.

Subsequently, from each of the above described specimens 1, a 4 mm long×0.7 mm wide×0.3 mm thick piezoelectric element was cut out. In this way, a specimen for measurement of the electric property $Q_{max}$ was obtained (FIG. 3). The results of measurement of the electric property $Q_{max}$ are shown in FIG. 4. The electric property $Q_{max}$ was measured at around 4 MHz using an impedance analyzer (4294A manufactured by Agilent Technology Co., Ltd.). $Q_{max}$ represents a maximum value of Q (=tan θ, θ: phase angle (deg)) between the resonant frequency fr and the anti-resonant frequency fa, which is one of important properties as a resonator and contributes to low-voltage drive.

For the mechanical strength, both surfaces of the above specimen were flattened by the lapping machine to obtain a thickness of 0.32 mm, the specimen was then cut into a size of 7.2 mm long×2.5 mm wide using a dicing saw, and the three-point flexural strength $\sigma_{b3}$ was determined from the formula (2) with a strength tester (Model 5543) manufactured by INSTRON Co, Ltd. The results are shown in FIG. 4.

Additionally, using the specimen for which $Q_{max}$ had been measured, $|\Delta F_0|$ was determined by the procedure described above. The results are shown in FIG. 4.

Figure 5:
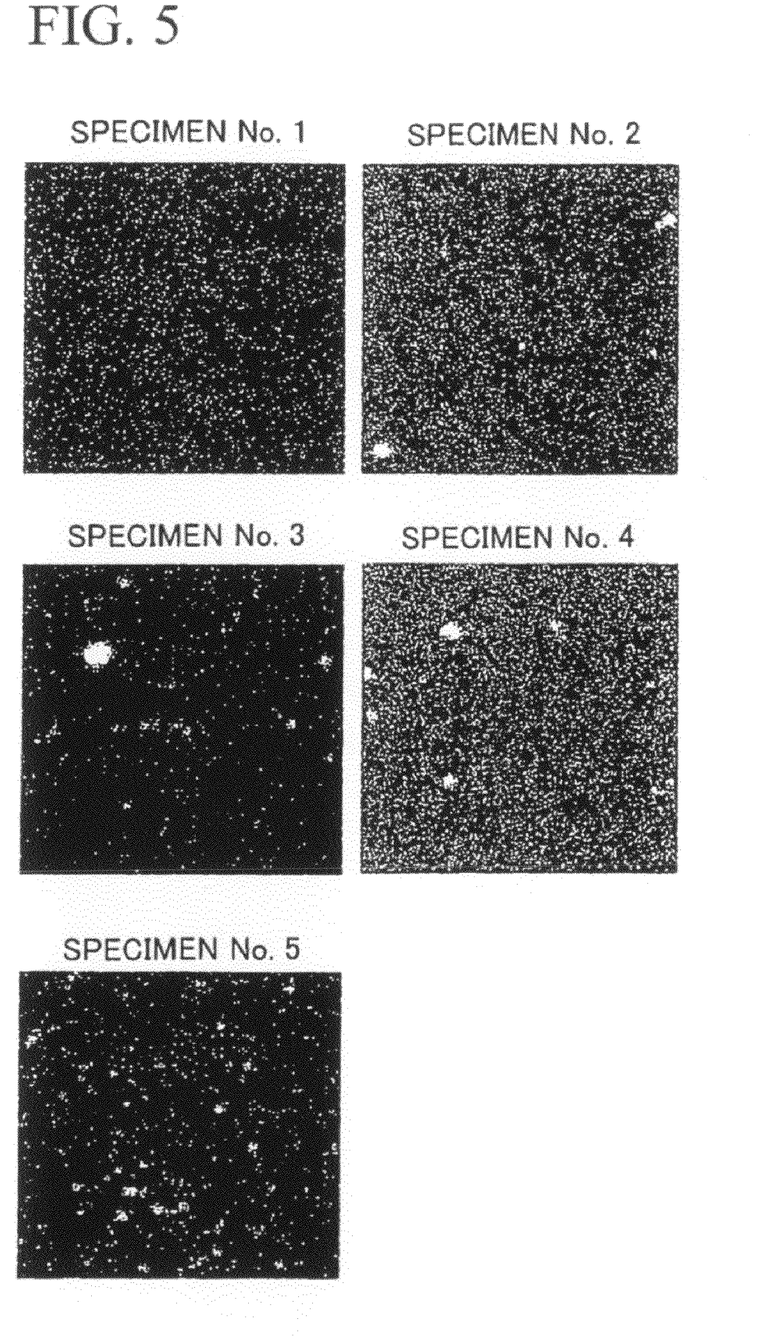
FIG. 5 shows the results of observing element distributions of specimens obtained in Example 1 using the SEM-EDS (SEM: scanning electron microscope, EDS: energy dispersive spectroscopy)

Additionally, the surface to be observed of the above specimen was polished with a diamond paste, and the element distribution thereof was observed by the EDS (energy dispersive spectroscopy) of an SEM (scanning electron microscope). The results are shown in FIG. 5. FIG. 5 shows that white areas have high concentrations of Al, and existence or nonexistence of the Al-containing phase was determined based on the result of this measurement. The results are shown in FIG. 4. In FIG. 4, a cross (X) indicates that the Al-containing phase does not exist, and an open circle (○) indicates that Al-containing phase exists. The Al-containing phase has a size of approximately 0.5 to 10 μm.

As shown in FIG. 4, it can be understood that existence of the Al-containing phase improves the heat resisting properties, and also improves $Q_{max}$ and the flexural strength. Addition of 0.1 wt % of $Al_2O_3$ does not result in generation of the Al-containing phase. Thus, it is understood that $Al_2O_3$ is contained in grains (lattices) composed of the main component to contribute to an improvement in heat resisting properties. Excessive $Al_2O_3$ incapable of being contained in grains is randomly precipitated in the grain boundaries to strengthen the binding between grains to contribute to an improvement in flexural strength. Thus, it is preferable that the amount of $Al_2O_3$ is set so that the Al-containing phase is formed in the piezoelectric ceramic composition if the flexural strength is required. By doing so, it is made possible to obtain a three-point flexural strength $\sigma_{b3}$ of 160 N/mm² or greater, further 170 N/mm² or greater, and still further 190 N/mm² or greater.

EXAMPLE 2

Figure 6:
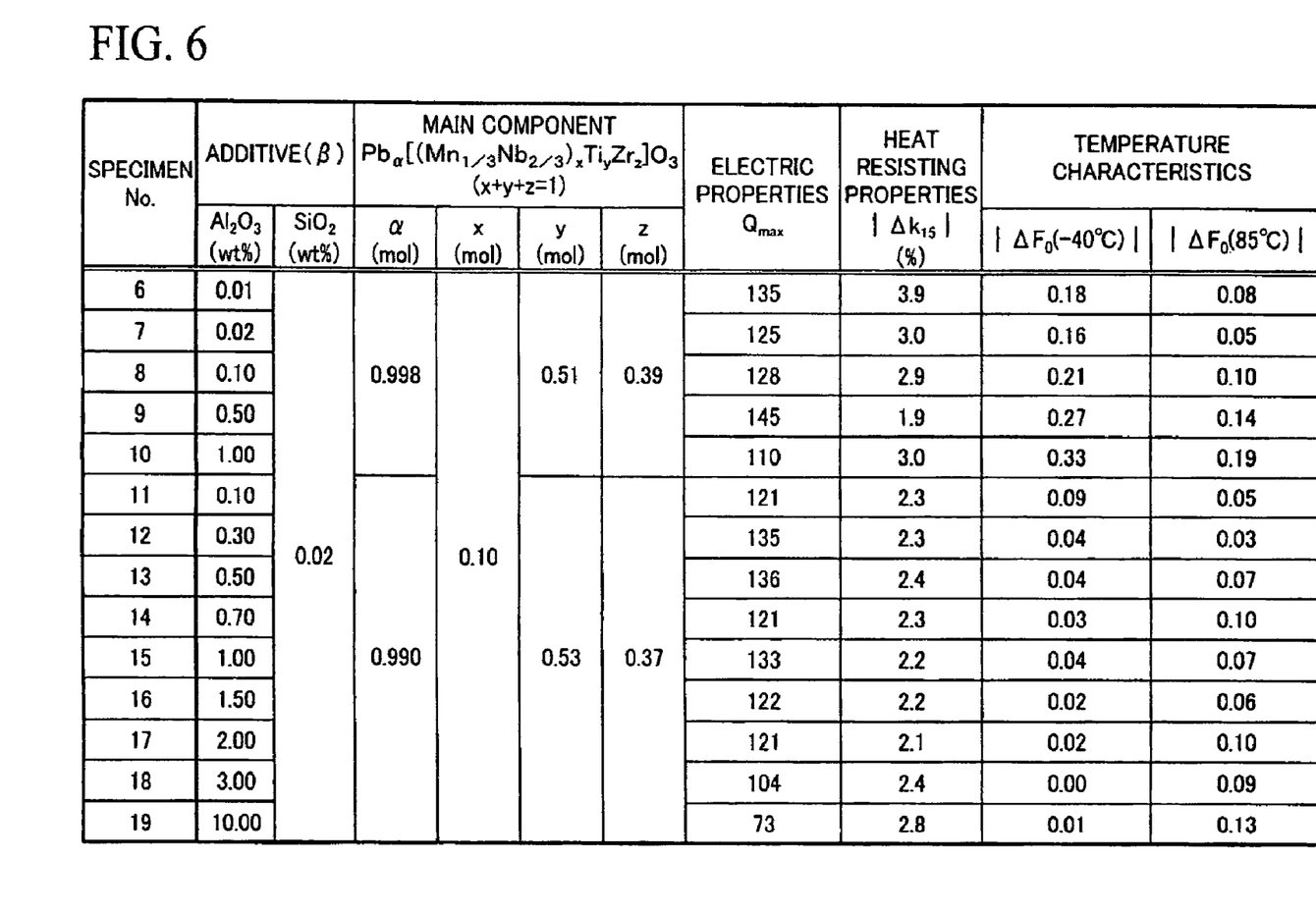
FIG. 6 is a table showing compositions and properties of specimens of Example 2.

A raw material powder same as that of Example 1 was weighed so as to obtain a composition of $Pb_{0.998}[(Mn_{1/3}Nb_{2/3})_{0.10}Ti_{0.51}Zr_{0.39}]O_3$ or $Pb_{0.990}[(Mn_{1/3}Nb_{2/3})_{0.10}Ti_{0.53}Zr_{0.37}]O_3$ in molar ratio, $SiO_2$ as an additive was then added in an amount of 0.02 wt % in relation to the total weight of the powders, $Al_2O_3$ powder was added in the amount shown in FIG. 6, and they were wet-mixed for 10 hours using a ball mill.

Specimens for measurement of the electric property $Q_{max}$ and the electromechanical coupling factor $k_{15}$ were obtained in the same manner as in Example 1 (FIG. 3). The electromechanical coupling factor $k_{15}$ represents efficiency of conversion from electric energy into mechanical energy or vice versa in a thickness-shear vibration mode, which is one of basic properties of a piezoelectric material, and it was calculated from the formula (7). For measurement of the electric property $Q_{max}$ and the electromechanical coupling factor $k_{15}$, the impedance analyzer (4294A manufactured by Agilent Technology Co., Ltd.) was used.

The obtained electric properties $Q_{max}$ are shown in FIG. 6. Using the specimen for which the electric property $Q_{max}$ had been measured, $|\Delta k_{15}|$ was determined by the procedure described above. The results are shown in FIG. 6.

The specimen, for which the electric property $Q_{max}$ had been measured, was placed in a thermostatic bath at 20° C., and the oscillation frequency $F_0$ (20° C.) at 20° C. was measured by a frequency counter (53181A manufactured by Agilent Technology Co., Ltd.) when the temperature was sufficiently stabilized. The specimen, for which the oscillation frequency $F_0$ (20° C.) at 20° C. had been measured, was placed in thermostatic baths at −40° C. and 85° C., and oscillation frequencies $F_0$ (−40° C.) and $F_0$ (85° C.) were measured when the temperature was sufficiently stabilized. Using the results of this measurement, $|\Delta F_0$ (−40° C.)$|$ and $|\Delta F_0$ (85° C.)$|$ were calculated from the formulas (10) and (11). The results of the measurement described above are shown in FIG. 6.

As shown in FIG. 6, the heat resisting property (the absolute value of the rate of change in electromechanical coupling factor $k_{15}$: $|\Delta k_{15}|$) is improved as the amount of $Al_2O_3$ added as an additive is increased. High levels of electric properties, heat resisting properties and temperature characteristics can be ensured even if the amount of $Al_2O_3$ added exceeds 10 wt %, although they depend on the composition of the main component. Thus, in the present invention, the amount of $Al_2O_3$ added is 0.01 to 15.0 wt %. If the amount of $Al_2O_3$ added is in this range, temperature characteristics of $|\Delta F_0$ (−40° C.)$|\leq 0.4\%$ and $|\Delta F_0$ (85° C.)$|\leq 0.4\%$ can be obtained.

EXAMPLE 3

Figure 7:
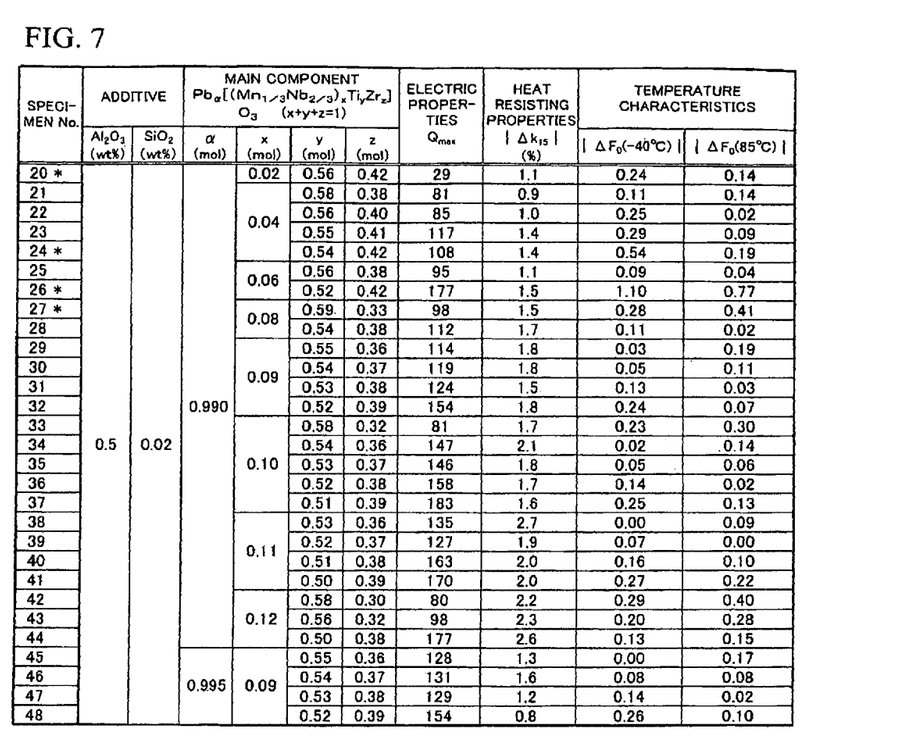
FIG. 7 is a table showing compositions and properties of specimens of Example 3.

The powder was weighed so as to obtain the composition shown in FIG. 7 (main component: $Pb_\alpha[(Mn_{1/3}Nb_{2/3})_xTi_yZr_z]O_3$), a piezoelectric ceramic composition was then fabricated in the same manner as in Example 2, and the properties were measured in the same manner as in Example 2. The results are shown in FIG. 7. In Example 3, $Al_2O_3$ and $SiO_2$ as additives are fixed, while values of α, x, y and z in the main component are varied. The marks, *, given to the specimen Nos. in FIG. 7 indicate Comparative Examples.

When specimens for which α representing the Pb content is 0.990 (Nos. 29 to 32) are compared with specimens for which α is 0.995 (Nos. 45 to 48), it can be said that they are comparable in temperature characteristics, but specimens for which α is 0.995 are superior in both electric properties $Q_{max}$ and heat resisting properties.

The specimen for which x representing the contents of Mn and Nb are small, i.e. 0.02 (No. 20), has a low value of the electric property $Q_{max}$, i.e. less than 30. Higher x is more preferable for the electric property $Q_{max}$, but tends to degrade heat resisting properties.

For the specimen having a large content of Ti, for which y is 0.59 (No. 27), the absolute value of $\Delta F_0$ (85° C.), $|\Delta F_0$ (85° C.)$|$, which is one of parameters of temperature characteristics, exceeds 0.4%. Referring to specimens No. 33 to 37, it can be understood that the temperature characteristics $|\Delta F_0$ (85° C.)$|$ tends to be degraded as y decreases.

Additionally, for specimens having a large content of Zr, for which z is 0.42 (Nos. 24 and 26), temperature characteristics are degraded. However, temperature characteristics tend to be degraded as z, i.e. the Zr content, decreases.

In the present invention, based on the above results, the main component has a composition in which α, x, y and z fall respectively within the ranges of $0.97\leq\alpha\leq 1.01$, $0.04\leq x\leq 0.16$, $0.48\leq y\leq 0.58$ and $0.32\leq z\leq 0.41$ in $Pb_\alpha[(Mn_{1/3}Nb_{2/3})_xTi_yZr_z]O_3$ (formula (1)).

EXAMPLE 4

Figure 8:
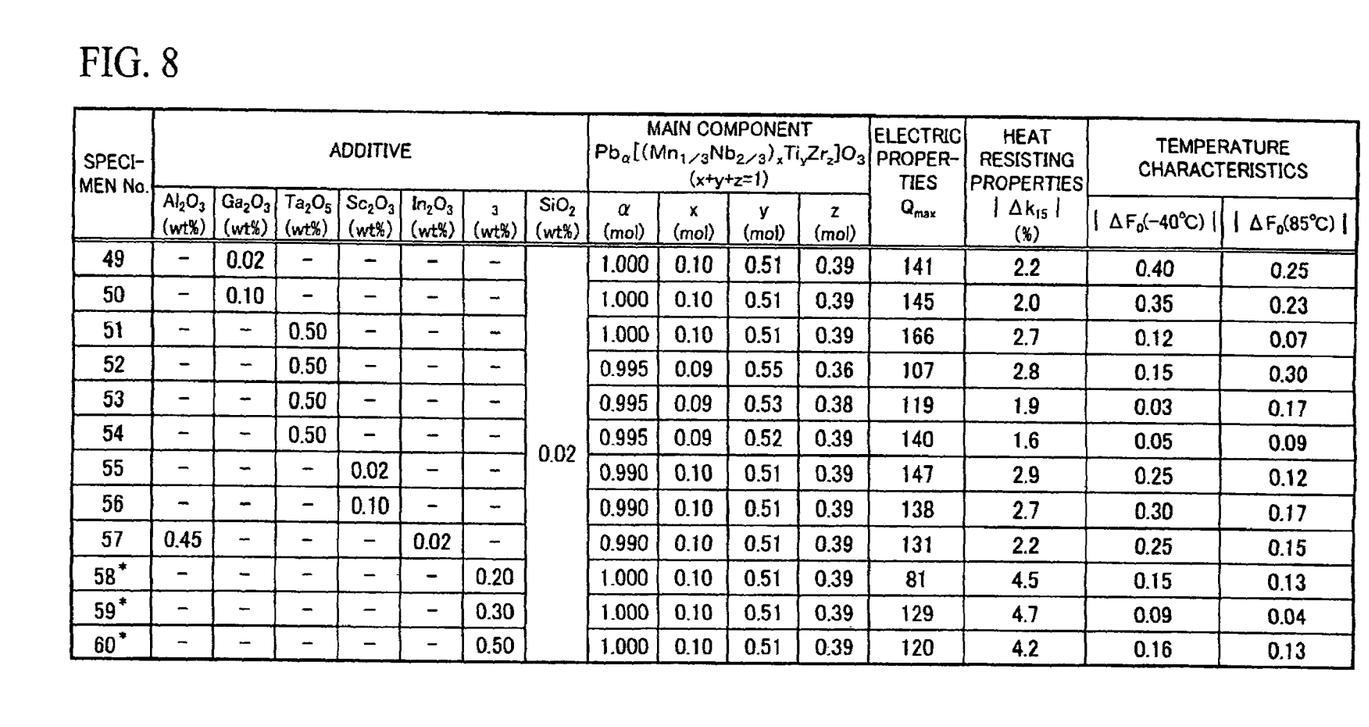
FIG. 8 is a table showing compositions and properties of specimens of Example 4.

A piezoelectric ceramic composition having the composition shown in FIG. 8 was fabricated in the same manner as in Example 2, and the properties were measured in the same manner as in Example 2. The results are shown in FIG. 8. $Ga_2O_3$ powder, $Ta_2O_3$ powder, $Sc_2O_3$ powder and $In_2O_3$ powder were prepared as raw material powders.

As shown in FIG. 8, it has been found that $Ga_2O_3$, $Ta_2O_3$, $Sc_2O_3$ and $In_2O_3$ exhibit effects same as those of $Al_2O_3$ described in Examples 1 and 2.

The invention claimed is:

1. A piezoelectric ceramic composition comprising:
   a phase comprising, as a main component, lead zirconate titanate having a perovskite structure; and
   an Al-containing phase,
   wherein:
   said main component is represented by a composition formula of $Pb_\alpha[(Mn_{1/3}Nb_{2/3})_xTi_yZr_z]O_3$ (wherein $0.97\leq\alpha<1.00$, $0.04\leq x\leq 0.16$, $0.50<y\leq 0.58$, $0.32\leq z\leq 0.41$) and
   said piezoelectric ceramic composition comprises $Al_2O_3$ in an amount of 0.6 to 15.0 wt %.

2. The piezoelectric ceramic composition according to claim 1, wherein:
   said piezoelectric ceramic composition is composed of a sintered body comprising grains and grain boundaries exist between said grains; and
   $Al_2O_3$ is contained in said grains and is precipitated in said grain boundaries.

3. The piezoelectric ceramic composition according to claim 1, wherein:
   $|\Delta F_0|$ which is the absolute value of the rate of change in oscillation frequency $F_0$ thereof, before and after application of a thermal shock, is 0.10% or less; and the three-point flexural strength $\sigma_{b3}$ thereof is 160 N/mm² or more.

4. The piezoelectric ceramic composition according to claim 1, wherein:
said piezoelectric ceramic composition comprises $Al_2O_3$ in an amount of 0.6 to 5.0 wt %.

5. The piezoelectric ceramic composition according to claim 1, wherein:
said piezoelectric ceramic composition comprises $Al_2O_3$ in an amount of 0.6 to 1.5 wt %.

* * * * *